United States Patent
Lee et al.

(10) Patent No.: US 6,432,205 B1
(45) Date of Patent: Aug. 13, 2002

(54) GAS FEEDING SYSTEM FOR CHEMICAL VAPOR DEPOSITION REACTOR AND METHOD OF CONTROLLING THE SAME

(75) Inventors: Kyu Hong Lee; Won Gu Kang; Sang Won Kang, all of Taejon (KR)

(73) Assignee: Genitech Co., Ltd. (KR)

( * ) Notice: Subject to any disclaimer, the term of this patent is extended or adjusted under 35 U.S.C. 154(b) by 0 days.

(21) Appl. No.: 09/554,535

(22) PCT Filed: Sep. 14, 1999

(86) PCT No.: PCT/KR99/00541

§ 371 (c)(1), (2), (4) Date: May 12, 1999

(87) PCT Pub. No.: WO00/15881

PCT Pub. Date: Mar. 23, 2000

(30) Foreign Application Priority Data

Sep. 14, 1998 (KR) .......................................... 98/37737

(51) Int. Cl.[7] .............................................. C23C 16/00
(52) U.S. Cl. ..................... 118/715; 118/719; 427/248.1
(58) Field of Search ................................ 118/715, 719; 427/248.1, 427

(56) References Cited

U.S. PATENT DOCUMENTS 4,844,006 A * 7/1989 Page, Jr. et al. ............ 118/715
5,730,804 A * 3/1998 Gomi et al. ................. 118/715
5,925,189 A * 7/1999 Nguyen et al. .............. 118/715
6,089,184 A * 7/2000 Kaizuka et al. ............. 118/728

FOREIGN PATENT DOCUMENTS

JP 60244332 4/1985
JP 4352326 7/1992

* cited by examiner

*Primary Examiner*—Bret Chen
(74) *Attorney, Agent, or Firm*—Marger Johnson & McCollom, P.C.

(57) ABSTRACT

A gas feeding system for applications such as chemical vapor deposition (CVD) is provided. The gas feeding system comprises a plurality of reactant source supply apparatuses that are connected to a reactor to supply different reactant sources therein discontinuously or sequentially. The gas feeding system includes a pass valve that is disposed in a supply tube between inlet and outlet valves of the reservoir for containing the reactant source. With the pass valve, the carrier gas passing therethrough flows into the reactor or the evacuation valve without passing through the reservoir when the inlet valve and outlet valve are closed to prevent the waste of non-use reactant sources. With the present invention gas feeding system, the uniformity and quality of the deposited film can be improved and the waste of reactant source can be reduced.

9 Claims, 2 Drawing Sheets

GAS FEEDING SYSTEM FOR CHEMICAL VAPOR DEPOSITION REACTOR AND METHOD OF CONTROLLING THE SAME

TECHNICAL FIELD

The present invention relates to a gas feeding system, and more particularly, to a gas feeding system for chemical vapor deposition (CVD) reactor capable of improving the uniformity and quality of deposited film in the manufacture of semiconductor devices. The present invention also relates to a method of controlling the same which prevents the waste of reactant source.

BACKGROUND ART

It is often desirable to form films of uniform thickness on a substrate in semiconductor manufacturing. Accordingly, considerable efforts have been made to improve both equipment and manufacturing process.

Recently, many processes for forming a high quality film were developed using surface reaction on a semiconductor substrate: processes such as using discontinuous supplies of a reactant source on a substrate, atomic layer epitaxy, and sequential supplies of a reactant sources on a substrate. The films formed by the above processes have enhanced uniformity and quality, and minimized impurity concentration therein, However, the above processes have a disadvantage of the waste of non-use and idling gaseous reactant sources.

In most conventional processes, one or more types of reactant sources were simultaneously and continuously supplied into a reactor, forming a film on a semiconductor substrate by the decomposition of reactant sources. However, such processes also have disadvantages that uniformity in film thickness, film quality, and impurity concentration are considerably affected depending upon the flow direction, flow velocity, temperature, types of used reactant sources.

DISCLOSURE OF INVENTION

Accordingly, it is an object of the present invention to provide a gas feeding system for chemical vapor deposition reactor and method of controlling the same capable of producing a high quality film when used for such process as using discontinuous or sequential supplies of a reactant sources.

It is another object of the present invention to provide a gas feeding system for chemical vapor deposition reactor and method of controlling the same capable of preventing the waste of non-use and idling gaseous reactant sources when not feeding the sources into the reactor.

In order to accomplish the aforementioned objects, the present invention provides a gas feeding system for chemical vapor deposition reactor having at least one reactant source supply apparatus, the supply apparatus each comprising: a mass flow controller for controlling the flow rate of a carrier gas which carries a reactant source; a reservoir for containing the reactant source, the reservoir having inlet and outlet valves for controlling the flow of the carrier gas through the reservoir; a supply valve for controlling the mass flow of the reactant source carried by the carrier gas to the reactor; an evacuation valve disposed between the outlet valve and the supply valve, the evacuation valve evacuating the carrier gas or the reactant source toward a vacuum pump; and a pass valve disposed between the inlet valve and the outlet valve so that the carrier gas passing therethrough flows into the reactor or the evacuation valve, the pass valve stabilizing the carrier gas mass flow controller as well as preventing the leakage of the reactant source from the reservoir.

In the embodiment, the number of the reactant source supply apparatus can be more than one, the supply apparatuses respectively having reservoirs containing different reactant sources, each of the supply apparatuses being connected to the reactor to supply different reactant sources therein in order to deposit complex materials such as PZT, BST, or SBT.

Preferably, the reactant source supply apparatus further comprises a first purge gas supply unit disposed between the supply valve and the reactor so as to prevent the backward flow of other reactant sources into the source supply apparatus upon deposition reaction. More preferably, the first purge gas supply unit further comprises a mass flow controller for controlling the flow of purge gas therethrough to a constant level.

In addition, the reactant source supply apparatus further comprises: a second purge gas supply unit disposed between the supply valve and the reactor so as to purge the reactant source residue; and a purge valve for regulating the flow of purge gas therethrough.

The present invention method is applicable to the control of a gas feeding system for chemical vapor deposition reactor having at least one reactant source supply apparatus, the supply apparatus each comprising: a reservoir for containing said reactant source, the reservoir having inlet and outlet valves for controlling the flow of the carrier gas through the reservoir; an evacuation valve disposed next to the outlet valve, the evacuation valve evacuating the carrier gas and the reactant source toward a vacuum pump; and a pass valve disposed between the inlet valve and the outlet valve.

The control method comprises the step of shutting off the inlet and outlet valves simultaneously with opening the pass valve so that the carrier gas passing therethrough flows into the reactor or the evacuation valve without the waste of reactant source in the reservoir.

In the control method, preferably, reactant source residue is removed by flowing the carrier gas into the reactor through the open pass valve. Additionally, the carrier gas is evacuated through the evacuation valve to stabilize the reactant source supply prior to the supply of reactant source from the reservoir to the reactor.

The foregoing, and other features and advantages of the invention, will be apparent from the following, more particular, description of the preferred embodiments of the invention, the accompanying drawings and the appended claims.

BRIEF DESCRIPTION OF DRAWINGS

Where considered appropriate, for brevity sake, reference numerals have been repeated among the figures to indicate corresponding elements.

BEST MODE FOR CARRYING OUT THE INVENTION

EXAMPLE 1

Figure 1:
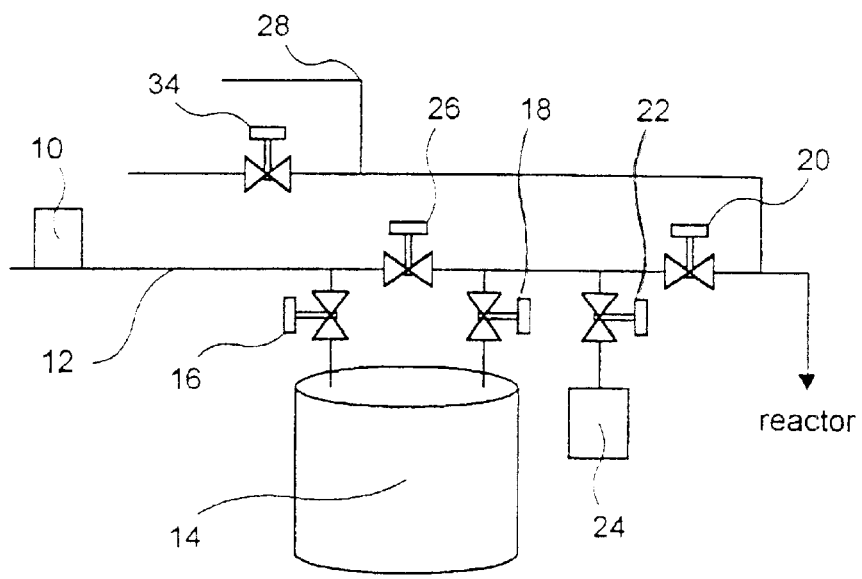
FIG. 1 is a schematic view of a gas feeding system in accordance with an embodiment of the present invention.

FIG. 1 is a schematic view of a gas feeding system in accordance with an embodiment of the present invention.

Referring to FIG. 1, a mass flow controller 10 for controlling the flow rate of a carrier gas to carry a reactant source is connected through a reactant source supply tube 12 to a reactor. The carrier gas is preferably an inert gas to prevent reaction with the reactant source. The reactant source in use for the film material is contained in a reactant source reservoir 14 connected to the supply tube 12. Between the supply tube 12 and reservoir 14, an inlet valve 16 and an outlet valve 18 are disposed to supply the reactant source into the reactor according to the flow of the carrier gas. In general, the reactant source contained in the reservoir 14 is a solid or liquid phase, but the reactant source should be vaporized within the reservoir 14 or on the supply tube 12 for the chemical deposition. A supply valve 20 is disposed between the outlet valve 18 and the reactor to regulate the flow of reactant source supplied into the reactor through the outlet valve 18. In most prior art techniques, the mass flow controller 10 is maintained in an "on" state for the subsequent process after the completion of reaction because it takes much time to stabilize the flow controller 10, especially when the controller 10 is "on/off" switched. Moreover, it also takes much time to stabilize the supply of the reactant source. In order to stabilize the reactant source supply by evacuating the reactant source or the carrier gas, the gas feeding system of the present invention comprises an evacuation valve 22 disposed between the outlet valve 18 and the supply valve 20. The evacuation valve 22 is connected to a vacuum pump 24. Additionally, a pass valve 26 for passing the carrier gas therethrough is disposed in the supply tube 20 between the inlet valve 16 and the outlet valve 18.

In order to prevent the backward flow of other reactant sources into the source supply apparatus upon deposition reaction, a first purge gas supply unit 28 is disposed between the supply valve 20 and the reactor, and the first purge gas supply unit 28 comprises a mass flow controller (not shown) for controlling the flow of purge gas therethrough to a constant level. Preferably, the purge gas is an inert gas to prevent reaction with the reactant source. The purge gas may or may not be the same as the carrier gas.

In addition, in order to purge the reactor of the reactant source residue after the supply of the source and before the the supply of another reactant source, a second purge gas supply unit for supplying large amount of purge gas is connected to the first purge gas supply unit 28. The second purge gas supply unit comprises a purge valve 34 for regulating the flow of purge gas therethrough.

The operation of the above gas supply system will now be described.

The operation can be divided into several sequential steps such as supply of reactant source, removal of the reactant source residue, standby for reactant source supply, and stabilization of the reactant source supply.

In the step of reactant source supply, the carrier gas passed through the mass flow controller 10 is introduced into the reactant source reservoir 14 through the inlet valve 16. Then, the carrier gas flows via the reactant source supply tube 12 and the outlet valve 18. The amount of reactant source supply can be controlled by both the flow rate of carrier gas and the temperature of reservoir 14. Thereafter, the reactant source is injected into the reactor through the supply valve 20, contributing film formation. In this step, the pass valve 26, both of the evacuation valve 22 and the purge valve 34 are shut off, and a small amount of purge gas is continuously supplied by the first purge gas supply unit 28 to prevent the backward flow of other reactant sources from the reactor.

In the next step the reactant source residue is removed from the reactor and the reactant source supply tube 12. Following two methods can be adopted to remove the reactant source residue.

In the first method, the purge valve 34 opens to purge the reactant source residue.

In the second method, both of the pass valve 26 and the supply valve 22 are open and the evacuation valve 22 is closed to deliver a sufficient amount of carrier gas to the reactor to purge the reactant source residue. In this step, both of the inlet valve 16 and the outlet valve 18 are all shut off to prevent the waste of the reactant source within the reservoir 14.

The step of standby for reactant source supply can be controlled by the following two methods.

In the first method applicable to a long standby time, all valves such as the inlet valve 16, the outlet valve 18 the supply valve 20, the pass valve 26 and the evacuation valve 22 as well as the mass flow controller 10 are shut off.

In the second method applicable to a short standby time, the carrier gas is directly evacuated to the vacuum pump 24 via both the pass valve 26 and the evacuation valve 22 while the inlet valve 16, the outlet valve 18 and the supply valve 20 are all closed.

The supply stabilization step of the reactant source differently proceeds depending upon the standby steps for reactant source supply.

If all valves are closed in the stabilization step of the reactant source, the pass valve 26 and the evacuation valve 22 are first opened to stabilize the mass flow controller 10, and then, the inlet and outlet valves 16 and 18 are opened with the closing of the pass valve 26 to stabilize the reactant source supply.

If the mass flow controller 10 is already held at a stabilized state in the standby step for reactant source supply, both the inlet and outlet valves 16 and 18 open with the closing of the pass valve 26 to stabilize the reactant source supply. This second stabilization step may or may not necessary depending upon an application.

EXAMPLE 2

Figure 2:
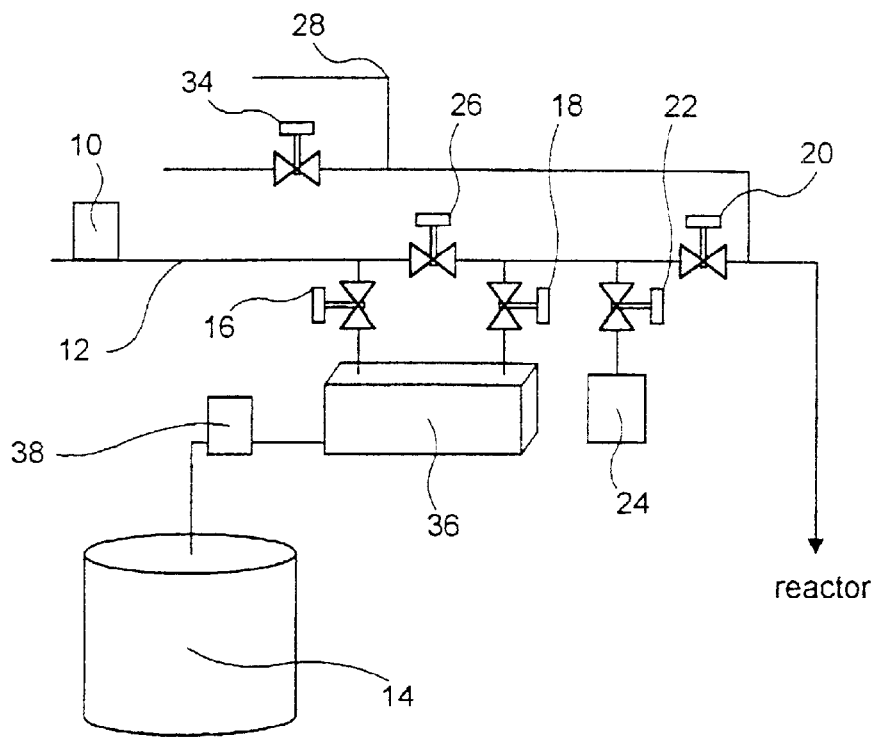
FIG. 2 is a schematic view of a gas feeding system, having a reactant source vaporizer, in accordance with another embodiment of the present invention.

FIG. 2 is a schematic view of a gas feeding system, having a reactant source vaporizer, in accordance with another embodiment of the present invention. Referring to FIG. 2, the difference between the example 1 and the example 2 is that a vaporizer 36 for vaporizing the reactant source is disposed between the reactant source supply tube 12 and the reactant source reservoir 14. Moreover, a minute flow pump 38 is disposed between the reservoir 14 and the vaporizer 36 for the effective control of reactant source supply and its vaporization. The vaporizer 36 vaporizes the reactant source in liquid phase contained in the reservoir 14 beforehand to supply the reactant source into the reactor. The operation of other parts of the gas feeding system is the same as that of the example 1.

EXAMPLE 3

Figure 3:
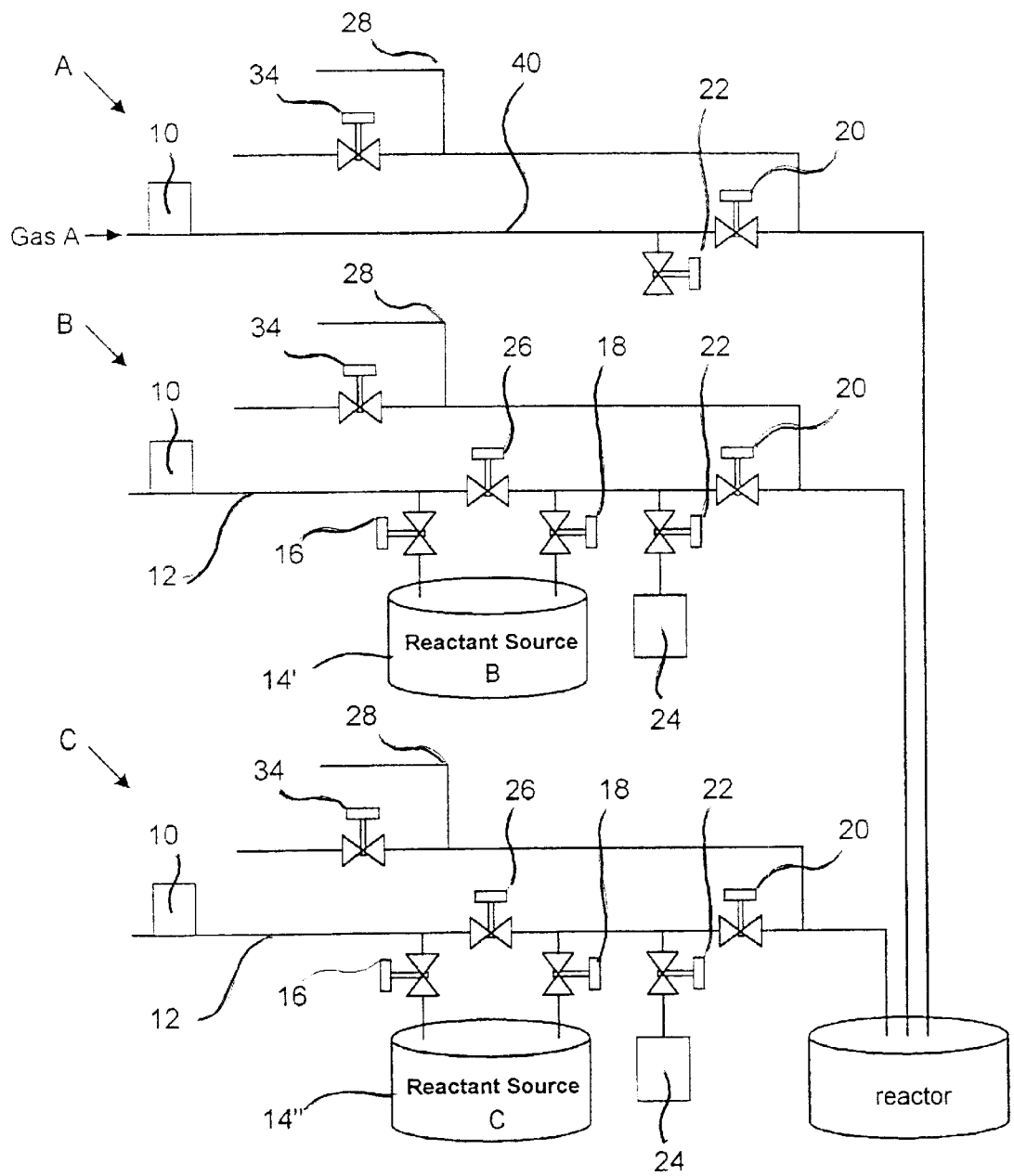
FIG. 3 is a schematic view of a gas feeding system with a plurality of reactant source supply apparatuses connected to one reactor, in accordance with another embodiment of the present invention.

FIG. 3 is a schematic view of a gas feeding system with a plurality of reactant source supply apparatuses connected to one reactor, in accordance with another embodiment of the present invention. Referring to FIG. 3, two reactant source supply apparatuses B and C, each being the same as described in the example 1, are connected to one reactor. Additionally, a reactive gas supply apparatus A is connected to the reactor via a reactive gas supply tube 40. The flow of gas A to the reactor is regulated by a supply valve 20 disposed on the reactive gas supply tube 40. An evacuation valve for evacuating the gas A is indicated with reference numeral 22.

As is the same as the examples 1 and 2, each supply apparatus comprises a first purge gas supply unit 28 and a mass flow controller (not shown) for the purge gas to prevent the backward flow of other reactant sources from the reactor upon deposition reaction. Additionally, each supply apparatus comprises a second purge gas supply unit for providing a sufficient amount of purge gas to purge the reactant source residue, and a purge valve 34 therefor.

Referring again to FIG. 3, an example of forming "BACA" layers repeatedly to a desired thickness will be described. The "BACA" unit layer can be formed by reacting the gas A with a thin layer containing the B component and then depositing a C component thin layer thereon. Hereinafter, "A" represents the gas supply apparatus A, "B" represents the reactant source supply apparatus B, and "C" represents the reactant source supply apparatus C.

The carrier gas passed through the mass flow controller 10 of "B" is introduced to the reactant source reservoir 14' via the inlet valve 16, and then, delivered to the reactant source supply tube 12 via the outlet valve 18. The reactant source B is introduced into the reactor. All of the first purge gas supply units 28 respectively flow small amounts of purge gases through the reactor to prevent the backward flow of the reactant source B into "A" and "C" from the reactor. At that time, "A" and "C" are held at standby state for reactant source supply as described in the example 1. Hereinafter, any gas which will not be described in each process step is held at standby state for reactant source supply.

After the formation of a thin layer B, the reactant source B residue within the reactor and the reactant source supply tube 12 is removed by the removal method described in the example 1. In the meantime, the gas A is held at a stabilization state. Thereafter, the gas A is introduced to the reactor to react with the thin layer B.

After the reaction between the gas A and the thin layer B, the gas A residue within the reactor and the reactant source supply tube 12 is removed by the method described in the example 1. In the meantime, the reactant source C is held at stabilization or stanby state. Thereafter, the reactant source C is introduced to the reactor to form a thin layer C.

After the formation of the thin layer C, the reactant source C residue within the reactor and the reactant source supply tube 12 is removed by the method described in the example 1. In the meantime, the gas A is held at stabilization state. Thereafter, the gas A is introduced to the reactor to react with the thin layer C.

After the reaction between the gas A and the thin layer C, the gas A residue within the reactor and the reactant source supply tube 12 is removed by the method described in the example 1. In the meantime, the reactant source B is held at stabilization or stanby state. Thereafter, the reactant source C is introduced to the reactor to form a thin layer C.

The above process steps of forming a thin layer and removal of residue are repeated to form a film comprised of sequentially deposited "BACA" layers.

In the exemplary embodiments of the present invention, the pass valve 26 is used to stabilize the mass flow controller, which significantly reduces the consumption of reactant sources. Moreover, the carrier gas passed through the mass flow controller 10 can be used to purge the reactant sources instead of the purge gas.

As another application of the present invention, a film can be formed by supplying reactant sources discontinuously as follows. For example, the reactant source B and the gas A are first simultaneously introduced to the reactor and then removed for a predetermined period of time. Next, the reactant source C and the gas A are simultaneously introduced to the reactor and then removed for a predetermined period of time. The above two process steps are sequentially repeated to form a film of a desired thickness.

What is claimed is:

1. A gas feeding system for chemical vapor deposition reactor having at least one reactant source supply apparatus, said supply apparatus comprising:

a mass flow controller for controlling the flow rate of a carrier gas which carries a reactant source;

a supply tube connected between said mass flow controller and a reactor for chemical vapor deposition;

a reservoir for containing said reactant source, said reservoir connected to said supply tube, said reservoir having inlet and outlet valves for controlling the flow of said carrier gas through said reservoir between said supply tube and said reservoir;

a supply valve for controlling the mass flow of said reactant source carried by said carrier gas to said reactor, said supply valve disposed between said outlet valve and said reactor;

an evacuation valve disposed between said outlet valve and said supply valve, said evacuation valve evacuating said carrier gas or said reactant source toward a vacuum pump; and a pass valve disposed in said supply tube between said inlet valve and said outlet valve so that the carrier gas passing therethrough flows into said reactor or said evacuation valve without passing through said reservoir when said inlet valve and outlet valve are closed, said pass valve stabilizing said carrier gas mass flow controller as well as preventing the leakage of said reactant source from said reservoir.

2. The gas feeding system of claim 1, wherein the number of said reactant source supply apparatus is at least two, said supply apparatuses respectively having reservoirs containing different reactant sources, each of said supply apparatuses being connected to said reactor to supply different reactant sources therein.

3. The gas feeding system of claim 1, further comprising a first purge gas supply unit disposed between said supply valve and said reactor so as to prevent the backward flow of other reactant sources into the gas feeding system upon deposition reaction.

4. The gas feeding system of claim 3, wherein said first purge gas supply unit further comprises a mass flow controller for controlling the flow of purge gas therethrough to a constant level.

5. The gas feeding system of claim 3, further comprising:

a second purge gas supply unit for supplying a purge gas, said second purge gas supply unit connected to said first purge gas supply unit, said second purge gas supply unit further comprising a purge valve for regulating the flow of purge gas therethrough.

6. The gas feeding system of claim 3, further comprising:

a second purge gas supply unit disposed between said supply valve and said reactor so as to purge a reactant source residue; and a purge valve for regulating the flow of purge gas therethrough.

7. The method of controlling a gas feeding system of claim 1 for chemical vapor deposition reactor having at least one reactant source supply apparatus, said method comprising:

shutting off said inlet and outlet valves simultaneously with opening said pass valve so that the carrier gas passing therethrough flows into said reactor or said evacuation valve without the waste of reactant source in said reservoir.

8. The method of claim 7, wherein said reactant source remaining in said reactor is removed by flowing said carrier gas into said reactor through the open pass valve.

9. The method of claim 7, wherein, prior to supplying said reactant source from said reservoir to said reactor, said carrier gas is evacuated through said evacuation valve to stabilize said reactant source supply.

* * * * *